United States Patent [19]

Houck et al.

[11] Patent Number: 5,439,638
[45] Date of Patent: Aug. 8, 1995

[54] METHOD OF MAKING FLOWABLE TUNGSTEN/COPPER COMPOSITE POWDER

[75] Inventors: David L. Houck, Towanda; Nelson Kopatz, Sayre, both of Pa.; Muktesh Paliwal, Owego; Sanjay Sampath, Coram, both of N.Y.

[73] Assignee: OSRAM Sylvania Inc., Danvers, Mass.

[21] Appl. No.: 92,727

[22] Filed: Jul. 16, 1993

[51] Int. Cl.$^6$ .............................. B22F 1/00; B22F 9/04
[52] U.S. Cl. .......................................... 419/30; 419/33; 75/343
[58] Field of Search ............... 419/30, 33; 75/343

[56] References Cited

U.S. PATENT DOCUMENTS

| | | | |
|---|---|---|---|
| 4,023,961 | 5/1977 | Douglas et al. | 75/0.5 AC |
| 4,390,368 | 6/1983 | Houck et al. | 75/251 |
| 4,395,279 | 7/1983 | Houck et al. | 75/0.5 BB |
| 4,716,019 | 12/1987 | Houck et al. | 419/17 |
| 4,735,652 | 4/1988 | Johnson et al. | 75/0.5 A |
| 4,773,928 | 9/1988 | Houck et al. | 75/0.5 R |
| 4,792,351 | 12/1988 | Johnson et al. | 75/0.5 A |
| 4,802,915 | 2/1989 | Kopatz et al. | 75/0.5 AA |
| 4,913,731 | 4/1990 | Kopatz et al. | 75/346 |
| 4,927,456 | 5/1990 | Kopatz et al. | 75/346 |
| 5,063,021 | 11/1991 | Anand et al. | 419/12 |
| 5,126,104 | 6/1992 | Anand et al. | 419/12 |
| 5,173,108 | 12/1992 | Houck | 75/365 |

*Primary Examiner*—Donald P. Walsh
*Assistant Examiner*—Scott T. Bluni
*Attorney, Agent, or Firm*—Elizabeth A. Levy; Robert F. Clark

[57] ABSTRACT

A method of making flowable tungsten/copper composite powder by milling an aqueous slurry of a mixture of the desired weight ratio of tungsten powder and copper oxide powder and, optionally, a small amount of cobalt powder, spray-drying the slurry to form spherical, flowable agglomerates, and reducing the agglomerates in a hydrogen atmosphere.

5 Claims, No Drawings

METHOD OF MAKING FLOWABLE TUNGSTEN/COPPER COMPOSITE POWDER

TECHNICAL FIELD

This invention relates to methods of making flowable tungsten/copper composite powders which can be pressed and sintered into dense parts.

BACKGROUND ART

Tungsten/copper composite powders are used in the manufacture of electronic components, such as heatsinks, electrical contacts and electrodes.

Because tungsten and copper do not alloy readily, various methods have been used to combine them in order to form tungsten/copper composite bodies. For example, tungsten powder may be pressed into a desired shape and then sintered to form a porous tungsten body. Molten copper may then be infiltrated into the tungsten body by capillary action.

U.S. Pat. Nos. 3,489,530 to Schreiner, and 3,449,120, 3,440,043 and 3,467,517 to Zdanuk et al. disclose methods of making tungsten/copper composite bodies using copper infiltration methods.

The amount of copper which may be incorporated into the tungsten body is determined by the porosity of the sintered tungsten body, which depends on the particle size of the tungsten powder used and the sintering conditions. Thus, the range of tungsten/copper compositions is limited when copper infiltration methods are used. Further, although tungsten powder may be pressed and sintered to obtain near net-shape parts, the subsequent copper-infiltration step creates a need for a final machining step to obtain finished dimensions. Finally, the copper infiltration methods are only economically feasible with tungsten bodies having basic geometries, since one or more final machining steps must always be performed after copper infiltration of the tungsten body.

Another method of obtaining a tungsten/copper composite body involves the blending and co-reduction in hydrogen of tungsten oxide and copper oxide powders to obtain a tungsten/copper composite powder, which may then be pressed and sintered to obtain a tungsten/copper composite body. Co-reduction methods are labor-intensive and expensive because they require one or more additional agglomeration steps to impart flowability to the resulting powders. They also require strict control of the reducing conditions, including temperature, hydrogen gas flow rate and powder bed depth during reduction, in order to obtain the desired powder particle size. Tungsten/copper composite powders produced by co-reduction of the respective oxides are extremely fine and tend to agglomerate during subsequent processing steps, thus limiting their usefulness in the powder metallurgical manufacture of small parts.

It would be an advancement in the art to provide a method of making tungsten/copper composite powders which are flowable and thus suitable for use in standard powder metallurgical manufacturing operations. It would also be an advancement in the art to provide a method of making tungsten/copper composite powders in which a broad range of copper contents is obtainable. It would also be an advancement in the art to provide a method of making tungsten/copper composite powders which overcomes the limitations inherent in the copper-infiltration and co-reduction methods.

SUMMARY OF THE INVENTION

It is therefore an object of this invention to obviate the disadvantages of the prior art.

It is another object of this invention to provide improved methods of making tungsten/copper composite powders.

It is another object of this invention to provide tungsten/copper composite powders having improved flowability.

It is another object of this invention to provide tungsten/copper composite powders having a broad range of copper content.

It is another object of this invention to provide a method of making tungsten/copper composite powders which overcome the limitations inherent in the prior art methods.

In accordance with one aspect of the invention, there is provided a method of making a flowable tungsten/copper composite powder suitable for pressing and sintering and containing between 5 and 60 weight percent copper and the balance tungsten, comprising the steps of: forming a uniform mixture of a desired weight ratio of tungsten powder, copper oxide powder and, optionally, less than 0.5 weight percent cobalt powder, milling the mixture in an aqueous medium to form a slurry in which the tungsten and copper oxide powders are intimately mixed, removing the liquid from the slurry to form spherical, flowable agglomerates, and subjecting the agglomerates to a reducing atmosphere to form a flowable tungsten/copper composite powder.

BEST MODE FOR CARRYING OUT THE INVENTION

For a better understanding of the present invention, together with other and further objects, advantages and capabilities thereof, reference is made to the following specification and appended claims.

Flowable tungsten/copper composite powders containing a broad range of copper content may be made by combining tungsten powder and copper oxide powder in the desired tungsten/copper weight ratio, optionally adding a small amount of cobalt powder as a sintering aid, milling the powder mixture in an aqueous medium to form a slurry, removing the liquid from the slurry, and reducing the solid material in a hydrogen atmosphere to obtain a flowable tungsten/copper composite powder.

The starting tungsten powder may be an agglomerated fine powder having an average particle size of approximately 1 micrometer. In contrast, the starting copper oxide powder may be much coarser, having an average particle size of up to 44 micrometers. Because of the great disparity in particle sizes between the two powder types, it is necessary to blend the two powders first in a blender in order to obtain a reasonably homogeneous mixture prior to the milling step.

An advantage of the process of this invention is the ability to control the particle size of the resulting tungsten/copper composite powder by selecting a tungsten powder which has the desired particle size.

A small amount of cobalt powder, less than 0.5 weight percent and preferably about 0.25 weight percent, may optionally be added to the powder mixture as a sintering aid.

The blended powder mixture may then be milled in an aqueous medium. The aqueous medium is preferably water, and the milling is preferably done in an attritor mill. The material is milled for approximately six hours with tungsten carbide/cobalt milling media. During the milling process, a highly exothermic reaction occurs between the aqueous medium, the tungsten powder and the copper oxide powder. It is therefore preferred that the aqueous slurry be maintained at a temperature of between 25° C. and 35° C., and preferably no greater than 30° C., during the milling process in order to control the rate of the reaction. The milling process deagglomerates the fine tungsten powder, pulverizes the copper oxide powder to a fine powder, and brings the copper oxide and tungsten powders into intimate contact.

After the slurry has been milled, it is preferably spray-dried to remove the liquid from the material and form spherical, free-flowing agglomerates.

The agglomerates may then be reduced in a hydrogen atmosphere at an elevated temperature to form tungsten/copper composite powders. Because the milled powder may be highly pyrophoric, it is desirable to envelop the milled powder in a nitrogen blanket prior to its entry into, and following its exit from, the hot hydrogen gas flow zone in the reducing furnace.

The milled and spray-dried powder is reduced preferably in 100% hydrogen flowing at a rate of 150 standard cubic feet per hour (SCFH) and at a temperature of between 700° C. and 730° C., preferably 715° C., for one hour. The by-products of the reduction step are carried away by the flowing hydrogen gas.

While sintering takes place between individual particles, the pressing of fine powders is greatly facilitated when the powder forms agglomerates. The tungsten/copper composite powder obtained from the process of this invention is free-flowing and has an average agglomerate size of about 150 micrometers. The average size of the individual particles of copper and tungsten in the agglomerates is between 1 and 2 micrometers.

The copper content in the tungsten/copper composite powder made by the method of this invention may range from 5 to 60 weight percent. A preferred powder composition contains 15% copper and the balance tungsten. Even when less than 10 weight percent copper is desired in the resulting composite powder, the copper is very finely and uniformly dispersed throughout the tungsten matrix.

The resulting tungsten/copper composite powder may be pressed and sintered using standard powder metallurgical manufacturing methods.

The following non-limiting example is presented.

EXAMPLE

The following powders in the indicated amounts were blended in a V-blender for 30 minutes:

| | |
|---|---|
| $Cu_2O$ | 28.4 kilograms |
| W | 140.0 kilograms |
| CO | 0.49 kilograms |

The blended powder mixture was then fed slowly into a Type 30S attritor mill manufactured by Union Process Co. and milled in 29 liters of water with 1/4" tungsten carbide/cobalt milling balls. The water was maintained at a temperature of 30° C.+/−5° and the powder mixture was milled for 6 hours at a mill speed of approximately 90 rpm.

The milled material was then spray-dried through a single fluid nozzle NIRO Model No. NA021-2637 spray dryer at an atomization pressure of 100 pounds per square inch and a feed rate of 60 kilograms per hour.

The spray-dried powder was transferred to Inconel boats and passed through a conventional pusher furnace which was maintained at 715° C. +/−15°. Hydrogen gas flowed through the furnace at a rate of 150 standard cubic feet per hour. The loaded boats were enveloped in a nitrogen blanket prior to entry into and after exit from the hot hydrogen gas flow zone. The loaded boats remained in the hot hydrogen gas flow zone for 1 hour.

The resulting tungsten/copper composite powder had a Hall flow rate of 23 seconds per 50 grams, a bulk density of 3.1 grams per cubic centimeter, and an approximate mean agglomerate size of 150 micrometers.

The tungsten/copper composite powder was pressed at 12,000 pounds per square inch and sintered in a hydrogen atmosphere to obtain a pressed and sintered tungsten/copper composite body at 98.1% of theoretical density.

While there have been shown what are at present considered to be the preferred embodiments of the invention, it will be apparent to those skilled in the art that various changes and modifications can be made herein without departing from the scope of the invention as defined by the appended claims.

We claim:

1. A method of making a flowable tungsten/copper composite powder suitable for pressing and sintering and containing between 5 and 60 weight percent copper and the balance tungsten, comprising the steps of:
   a) forming a uniform mixture of a desired weight ratio of tungsten powder, copper oxide powder and, optionally, less than 0.5 weight percent cobalt powder;
   b) milling said mixture in an aqueous medium to cause an exothermic reaction between said aqueous medium, said tungsten powder and said copper oxide powder, said milling further acting to form a slurry in which said tungsten and copper oxide powders are intimately mixed, said slurry being maintained at a temperature between about 25° C. to about 35° C. to control said exothermic reaction;
   c) removing the liquid from said slurry to form spherical, flowable agglomerates; and
   d) subjecting said spherical, flowable agglomerates to a reducing atmosphere to form said flowable tungsten/copper composite powder.

2. A method according to claim 1 wherein said flowable tungsten/copper composite powder contains 15 weight percent copper and the balance tungsten.

3. A method according to claim 1 wherein said mixture is attritor milled in water for 6 hours at a temperature of 30° C.

4. A method according to claim 1 wherein said liquid is removed from said slurry by spray drying said slurry.

5. A method according to claim 1 wherein said spherical, flowable agglomerates are reduced in a hydrogen atmosphere at 715° C. for 1 hour.

* * * * *